United States Patent [19]
Ho et al.

[11] Patent Number: 4,587,464
[45] Date of Patent: May 6, 1986

[54] ELECTRON BEAM CONTROL SYSTEM

[75] Inventors: Cecil T. Ho, Poughkeepsie; John G. Wilman, Hopewell Junction, both of N.Y.

[73] Assignee: International Business Machines Corporation, Armonk, N.Y.

[21] Appl. No.: 626,357

[22] Filed: Jun. 29, 1984

[51] Int. Cl.[4] .............................................. H01J 29/58
[52] U.S. Cl. ..................................... 315/382; 315/370
[58] Field of Search ....................... 315/408, 370, 382; 358/218

[56] References Cited
U.S. PATENT DOCUMENTS 3,409,799 11/1968 Kurzweil, Jr. et al. ............. 358/218
3,686,527 8/1972 Gabor .................................. 315/382
4,132,908 1/1979 Hughes ............................... 315/399

Primary Examiner—Theodore M. Blum
Attorney, Agent, or Firm—Sughrue, Mion, Zinn, Macpeak and Seas

[57] ABSTRACT

A high speed focus control circuit for an electron beam projection system. The circuit includes a conventional digital to analog converter, comprising a register for storing an n-bit digital value, and n current drivers, each of which provides a current which is proportional to the associated bit weighted value. Rather than summing the currents from all n current drivers and driving a single focus coil, each current driver is connected to one of n individual coils, wound on a common bobbin. This reduces circuit capacitance and permits higher switching speed.

7 Claims, 2 Drawing Figures

ELECTRON BEAM CONTROL SYSTEM

BACKGROUND OF THE INVENTION

Electron beam (E-beam) lithography systems utilizing a variably shaped spot (VSS) without high speed focus correction have operating limitations; i.e., lower thruput or less distinct spot images. The electron beam is shaped to various sizes, having spot areas varying typically in the range of 1-100 $\mu m^2$ and consequently beam focus and therefore current densities vary. Additionaly, such E-beam systems require high speed beam switching times in order to provide system throughputs at acceptably high values. Typical switching speeds must be in the order of 25 ns. Existing deflection control circuits, such as high analog voltage parallel plate deflection control devices cannot meet this timing requirement.

Prior art representative of such systems is typified in IBM TDB vol. 21, No. 8, page 3185 and U.S. Pat. Nos. 3,192,433, 3,903,455 and 4,132,908.

Typically in such prior art systems, a single deflection coil is driven by an output generated as a consequence of the sum of a number of D/A current drivers. Each of these drivers has some device and parasitic capacitances. When the drivers are summed at a single coil, the capacitances add and tend to limit switching speed.

Also, in driving such coils at high speeds, high switching voltages are required since $V = L di/dt$. Thus, high voltages and high currents require large switching devices. Such switching devices in turn have large capacitances which tend to resonate with coil inductance. This also tends to limit switching speed.

SUMMARY OF THE INVENTION

Given the deficiencies in prior art systems, this invention provides a high speed deflection control circuit for an electron beam projection system. The circuit utilizes a digital to analog converter comprising N register for storing an N-bit digital values. The invention employs n current drivers, each of which provide a discrete current which is proportional to the associated bit shape weighted value. The invention departs from the prior art by not summing the currents from all n current drivers and driving a single deflection coil. Rather, in accordance with this invention, each current driver is connected to one of n individual coils which are in turn wound on a common bobbin. This technique reduces output capacitance and permits higher switching speeds.

The present invention also eliminates the large transistors previously used for driving the coil. Rather, as a replacement for a large pair of such drivers, this invention employs two pairs of small transistors to materially reduce the capacitance at the output of the current drivers. One pair of transistors provides the high transient voltage during switching while the other pair provides the sustained current at a much lower voltage. Consequently, the two pairs of transistors operate at very low power when compared with the prior art and consequently allowing them to be very low capacitance devices. This makes it possible to achieve a switching time between spots at a very high rate, on the order of 25 ns.

This invention will be described by referring to the attached drawing and the description of the preferred embodiment that follows.

DESCRIPTION OF THE PREFERRED EMBODIMENT

Figure 1:
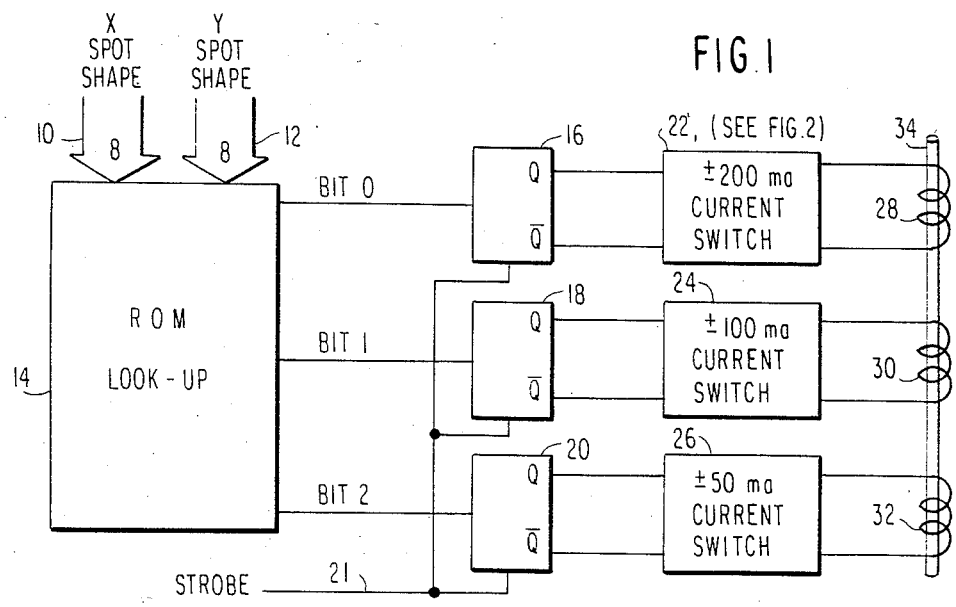
FIG. 1 is a schematic circuit diagram showing the overall use of separate coils on the same bobbin pin.

Referring now to FIG. 1, a schematic system diagram of this invention is depicted. In conventional systems, a three bit digital to analog converter is employed using three current switches. Due to device variation and parasitics, the switching times tend to skew causing ringing which therefore deteriorates the settling time of the system. As shown in FIG. 1, this invention departs significantly from the prior art by utilizing three separate coils located on the same bobbin pin.

Specifically, two eight bit input signals 10 and 12, are delivered to a ROM 14 for purposes of determining spot size. Eight bit spot shape signal 10 is indicative of the X-spot size and eight bit spot shape signal 12 is indicative of the Y-spot size of a projected spot. The ROM 14 contains a look-up table wherein the two eight bit signals 10 and 12 indicative of total spot area are converted into appropriate current values to determine beam focus correction. The output of the ROM 14 comprises three bits fed to latches 16, 18 and 20. As will be appreciated by one of working skill, each of the latches 16, 18 and 20 receives a second input signal along timing line 21 for delivering a selectively gated output to the three current switches 22, 24, and 26.

Three current switches are at different amperage ranges, switch 26 at a ±50 ma range, switch 24 at a ±100 ma range and switch 22 at a ±200 ma range. Thus, a total current range of ±350 ma is available. The outputs of each of the switches are coupled respectively to coil 32, 30 and 28, each typically rated at 1 $\mu h$.

In accordance with the present invention, each of the coils, 28, 30 and 32, are wound on the samebobbin pin 34.

As shown in FIG. 1, each current switch, 22, 24 and 26, is therefore associated with an individual coil, 28, 30 and 32. In prior art systems, the outputs of the switches would be summed into a single coil. In the present invention, the loading effect of the three coils on each other is negligible, that is, immeasurably small. Flexibility, however, over a current range of ±350 ma is achieved.

It will be appreciated that while three latches, three current switches and three coils are shown in the example of FIG. 1, any number, that is n latches, n switches and n coils may be employed within this aspect of the present invention.

Figure 2:
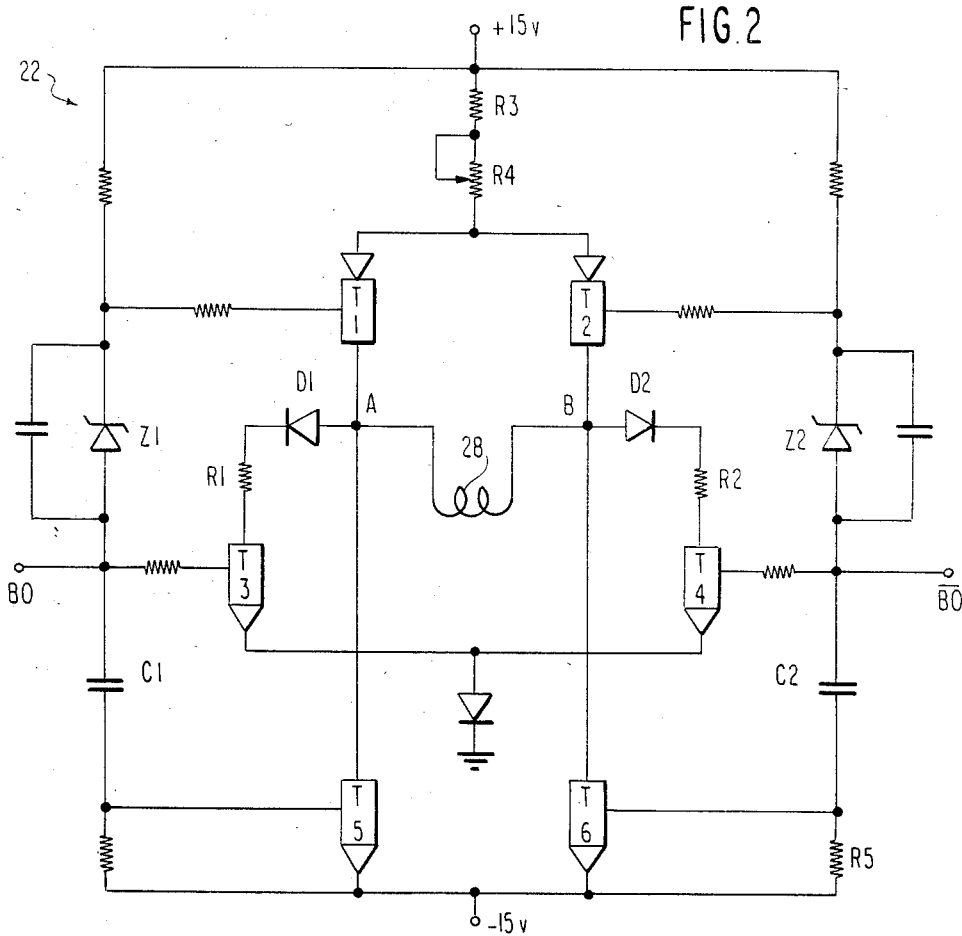
FIG. 2 is a schematic circuit diagram showing one current switch utilized in the system of FIG. 1.

Referring now to FIG. 2, a circuit diagram of one of the current switches is depicted. The circuit for all of the current switches would be fundamentally identical in terms of circuitry but would be adjusted to provide the necessary current range of a particular switch. Thus, to adjust the current range, the values of resistors R3 and R4 would be typically varied.

The circuit 22 as illustrated in FIG. 2, is used to drive the coil 28 typically at a 1 $\mu h$ load. The switch operates with complementary inputs, that is with BØ high and BØ low and then reversed. Thus, in the initial conditions, BØ is set high (TTL) and transistors T2 and T3 are turned on. The current in the inductor 28 then flows from point B to point A.

When the input to BØ drops, that is when it is switched to a low value, and BØ is high, the base voltage of transistor T1 drops because of the voltage drop across the zener diode Z1. Thus, transistor T1 will be turned on and conversely, transistor T2 will be switched off. At the same time, T3 is turned off while transistor T4 is turned on. Transistor T6 is pulsed on by capacitor C2, thereby providing increased voltage, in the order of 22 volts available between points A and B. This produces a quick reversal of the current flow in the load 28. As indicated, transistor T4 is on but is not conducting any collector current because diode D2 is reverse biased. This protects transistors T4 from reverse breakdown. In a comparable nature, the current through capacitor C1 turns transistor T5 off. Thus, transistors T1, T4 and T6 are on while transistors T2, T3 and T5 are turned off.

Since transistor T6 is turned on by means of the C2 capacitive coupling, it is turned on heavily and is pulsed for less than 30 ns. By this time, the current in the load is settled.

As T6 turns off, the voltage at B rises and the current is transferred to T4. That is, since C2 and R5 at the base of T6 form a RC combination, the voltage at the base decreases as a function of the RC time constant. During this time period, diode D2 is reverse biased while T6 is on. When the voltage at point B rises, T4 conducts current and transistor T6 is turned off. Stated differently, as transistor T6 turns off, the voltage at point B rises and the current is transferred to transistor T4. A resistor, R2, causes a voltage drop such that transistors T1 and T4 run close to their saturation levels thereby reducing power requirements. Power requirements for transistors T5 and T6 are also very low since they are turned on for only very short periods of time.

Thus, power dissipation is kept very low in the transistors with T5 and T6 typically having a maximum duty cycle of only 6%. As noted, transistors T1, T2, T3 and T4 run at or close to saturation due to the dropping resistors R1 and R2. This enables those transistors to be very low powered and therefore very low capacitance devices. The switch of FIG. 2 is therefore capable of very high switching speeds between spots, typically in the range of 25 ns.

It will be appreciated that the circuit of FIG. 2 can be implemented as a function of the current output required. Transistors T1 and T2 may typically be 2N5583 devices, transistors T3 and T4 MD2369A devices and transistors T5 and T6 2N2369A devices. The values of the other circuit elements are adjusted as a consequence of such circuit operation. Typically, for value R3 of 22 ohms and 10 ohms for resistor R4, the dropping resistors R1 and R2 would be 50 ohms. Capacitors C1 and C2 may be typically 100 pf devices with the other trimming resistors and capacitors appropriately set.

Thus, by the circuit of FIG. 2, T1, T2, T3 and T4 provide sustained current at a lower voltage while T5 and T6 provide high transient voltages during switching.

This invention may be modified without departing from the essential scope thereof. For example while spot shaping is defined as changing the X and Y dimensions of a spot image to obtain rectangles of various sizes, shapes other than rectangles may also be used.

We claim:

1. An elecrron beam cross section control comprising:
    a digital to analog converter receiving digital signals indicative of electron beam spot size; n registers each storing a bit of a digital shape value; n current drivers coupled to respective ones of said n registers, each of said n current drivers providing a current that is proportional to the weighted value of the associated bit; and
    n coils coupled to respective ones of said n current drivers, all of said n coils being wound on a common bobbin.

2. The system of claim 1 wherein said digital to analog converter further comprises a read only memory containing a converson table of beam currents as a function of X-Y spot size signals to provide bits of said digital shape value to said registers.

3. The system of claim 2 wherein said registers comprise a pluralty of n latches, a clock source for providing one input to said latches and said read only memory providing discrete bit values to each of said latches as a second input.

4. The system of claim 1 wherein said n current drivers comprise n semiconductor current switches each of which delivers a discrete current to a respective coil with a value that differs from the others of said current switches.

5. The system of claim 1 wherein each of said current drivers comprises a first pair of transistors coupled with a coil for providing a sustained current to said coil and a second pair of transistors coupled with said coil to provide a high transient voltage during switching of the coil on or off.

6. The system of claim 5 further comprising means for adjusting the input voltage to said current driver.

7. The system of claim 5 further comprising a pair of switching transistors receiving inputs from said registers, said switching transistors coupled in series with said coil and receiving compliance voltage from said pair of transistors to said coil during switching.

* * * * *